United States Patent [19]
Mase

[11] Patent Number: 5,235,741
[45] Date of Patent: Aug. 17, 1993

[54] ELECTRICAL CONNECTION AND METHOD FOR MAKING THE SAME

[75] Inventor: Akira Mase, Atsugi, Japan

[73] Assignee: Semiconductor Energy Laboratory Co., Ltd., Kanagawa, Japan

[21] Appl. No.: 928,036

[22] Filed: Aug. 11, 1992

Related U.S. Application Data

[62] Division of Ser. No. 567,648, Aug. 15, 1990, Pat. No. 5,155,301.

[30] Foreign Application Priority Data

Aug. 18, 1989 [JP] Japan ................................. 1-213244

[51] Int. Cl.[5] ............................................. H05K 3/36
[52] U.S. Cl. .......................................... 29/830; 29/872; 156/275.7; 156/276
[58] Field of Search .................... 29/830, 868;872; 156/276, 275.7, 272.2

[56] References Cited

U.S. PATENT DOCUMENTS

| | | | |
|---|---|---|---|
| 4,113,981 | 9/1978 | Fujita et al. | 174/88 R |
| 4,554,033 | 11/1985 | Dery et al. | 29/830 |
| 4,588,456 | 5/1986 | Dery et al. | 174/88 R |
| 4,606,962 | 8/1986 | Reylek et al. | 156/272.2 |
| 4,642,421 | 2/1987 | Dery et al. | 174/88 R |
| 4,740,657 | 4/1988 | Tsukagoshi et al. | 29/868 |
| 4,814,040 | 3/1989 | Ozawa | 156/63 |
| 4,959,178 | 9/1990 | Frentzel et al. | 252/514 |
| 4,999,460 | 3/1991 | Sugiyama et al. | 174/94 R |
| 5,001,302 | 3/1991 | Atsumi | 174/94 R |

FOREIGN PATENT DOCUMENTS 0242025 10/1987 European Pat. Off.
2549627 1/1985 France.

*Primary Examiner*—P. W. Echols
*Assistant Examiner*—David P. Bryant
*Attorney, Agent, or Firm*—Sixbey, Friedman, Leedom & Ferguson

[57] ABSTRACT

Electrical connection between electrode arrangements formed on first and second substrates is described. The first substrate is placed over the second substrate with a UV light curable adhesive between them. The UV light curable adhesive carries first and second particles dispersed therein. The first and second substrates are pressed against each other and exposed to UV light in order to harden the adhesive. The first particles are made from conductive particles and preferably resilient and function to form current paths between the electrodes of the first and second substrates. The second particles function to prevent the first particles from being destroyed by excess deformation.

16 Claims, 4 Drawing Sheets

F I G. 3
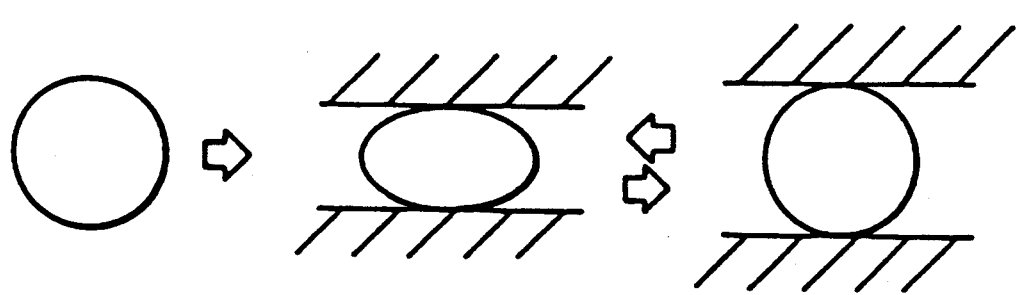

ELECTRICAL CONNECTION AND METHOD FOR MAKING THE SAME

This is a divisional application of Ser. No. 07/567,648, filed Aug. 15, 1990, now U.S. Pat. No. 5,155,301.

BACKGROUND OF THE INVENTION

1. Field of the Invention

The present invention relates to an electrical connection and a method for making the same.

2. Description of the Prior Art

Electrical connection between substrates respectively carrying electrode arrangements has been made through FPC (Flexible Print Circuit). This connection is illustrated in FIG. 1. A substrate 7a is provided with an electrode arrangement. The electrode arrangement 8a consists of a number of electrode strips 8a which are desired to make electrical connection with corresponding electrode strips 8b provided on another substrate 7b. An FPC 9 comprises a flexible sheet made from polyimide carrying a number of conductive strips 10 corresponding to the strips of these substrates 7a and 7b. The coupling of the strips 10, 8a and 8b of the sheet and the substrates is made through an anisotropic conductive films 11.

This method of making electrical connection includes the following shortcomings. First, since the connection is made through an FPC, there are two coupling sites which require much care and processes as compared with the case of a single site connection. The possibility of connection error is also doubled. Second, the FPC is adhered to the substrates at a high temperature under pressure. The flexible sheet is thermally expanded during with thermal treatment, and the alignment of the conductive strips with the corresponding strips of the substrates is often sheared, resulting in disconnection or connection error. Third, the FPC sometimes comes off from the substrate when external force is applied just after the connection is completed.

These conventional disadvantages are considered originating from the structure of the anisotropic conductive film. FIG. 2 is an explanatory view showing the conventional structure of the anisotropic conductive film. The film is comprised of a sheet 11a of adhesive in which are large number of conductive particles 11b are dispersed uniformly. Because the conductive particles can not to be deformed, the electrodes 10 and 8a are easily disconnected from the particles when the surrounding temperature changes and they are thermally expanded or contracted with reference to the diameter of the particles.

BRIEF SUMMARY OF THE INVENTION

It is an object of the present invention to increase the yield of electrical connection made between electrode strips formed on substrates.

It is another object of the present invention to provide electric connection of simple structure and a method of making the same.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, electrodes on a first substrate are placed over counterpart electrodes on a second substrate with a UV light curable adhesive between them. The UV light curable adhesive carries first and second particles dispersed therein. The first and second substrates are pressed against each other and exposed to UV light in order to harden the adhesive. The first particles are made from conductive particles and preferably resilient and function to form current paths between the electrodes of the first and second substrates. The second particles function to prevent the first particles from being destroyed by excess deformation.

Namely, as illustrated in FIG. 3, the first particles maintain their 100% diameter in advance of application of pressure. The diameter is decreased to 60-95% of the original value when the pair of substrates are joined under pressure. The contact between the first particles and the electrodes of the substrates, however, is ensured as long as the relative deformation of the substrates exceeds 100%-(60~95%) of the diameter because of the resilience of the particles. This is made certain furthermore by making use of light instead of heat to harden the adhesive carrying the first and second particles. Other shortcomings arising from the high temperature during heat treatment are also removed.

BRIEF DESCRIPTION OF THE DRAWINGS

The accompanying drawings, which are incorporated in and form a part of the invention and, together with the description, serve to explain the principles of the invention.

FIG. 3 is an explanatory view showing the action of conductive particles in accordance with the present invention.

DETAILED DESCRIPTION OF THE PREFERRED EMBODIMENTS

Figure 1:
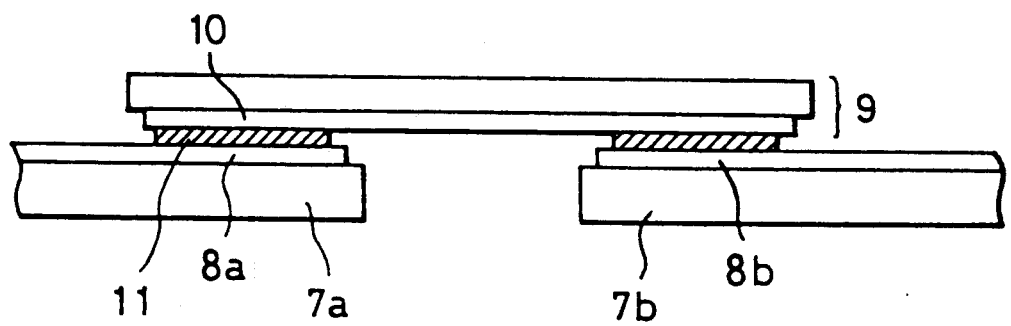
FIG. 1 is a side view showing a prior art connection.
Figure 2:
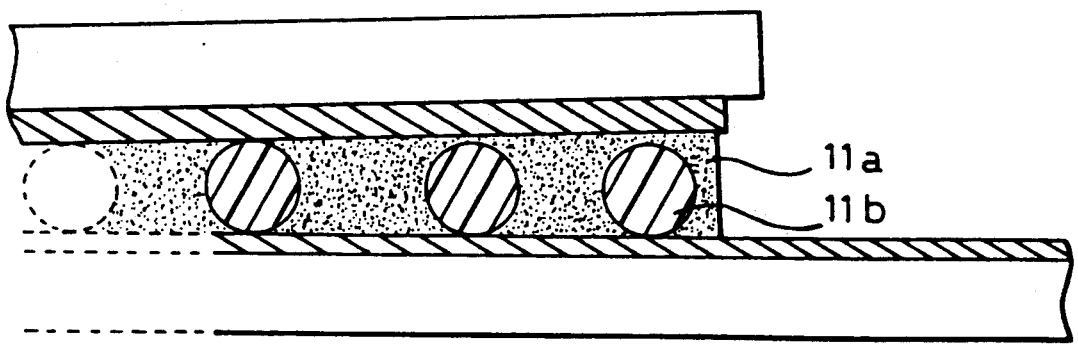
FIG. 2 is an expanded partial view showing a prior art connection.
Figure 4:
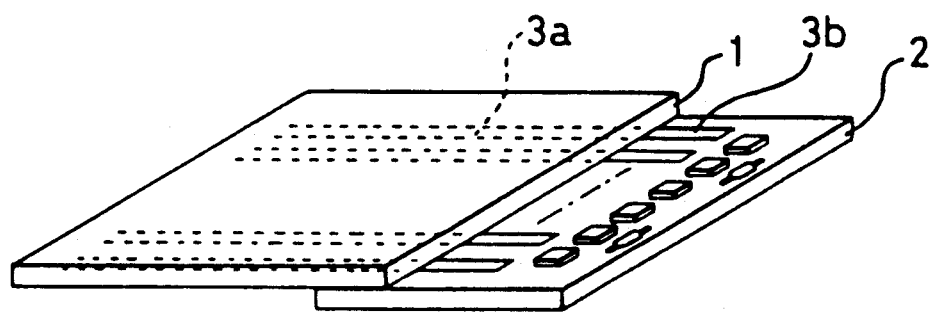
FIGS. 4 and 5 are perspective and expanded partial cross sectional views showing electrical connection in accordance with an embodiment of the present invention.
Figure 5:
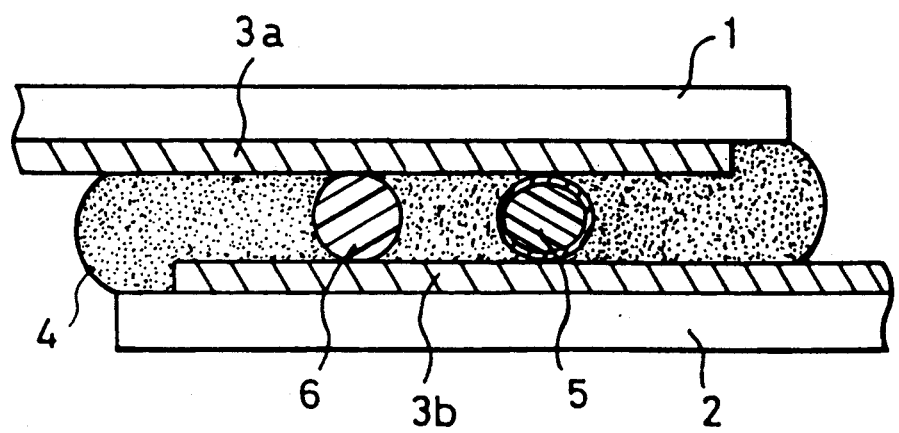

Referring now to FIGS. 4 and 5, which illustrate a preferred embodiment of the invention, a glass substrate 1 is formed with a number of parallel conductive strips 3a made from a transparent conductive material such as indium tin oxide (ITO) while a printed circuit board 2 is provided with a number of parallel conductive strips 3b made of copper corresponding to the strips 3a of the glass substrate 1. The glass substrate 1 is used for forming a liquid crystal display by sandwiching a liquid crystal layer between it and a counterpart similar substrate. The circuit formed on the board 2 is provided to supply driving signals to the strips 3a and 3b.

FIG. 5 shows the connection between the strips 3a and 3b. Between the board 2 and the substrate 1 is a UV light curable insulating adhesive 4 in which a number of first fine particles 5 and second fine particles 6 are dispersed. The diameter of the first particles 5 is slightly larger than that of the second particles 6. The adhesive 4 is exposed to UV light with the board 2 being pressed against the substrate 1 so that the first particles is deformed to allow the distance therebetween to decrease to the diameter of the second particles. The second particles are provided in order to keep the first particles from being deformed too much.

Since the first particles have to make electrical paths between the strips $3a$ and $3b$, they are made from a conductive material such as a metal. Preferred resilient particles can be provided as the first particles by coating a metallic film such as Au film on fine spheres of organic resin such as polystyrene. The second particles can be made from any material as long as they are sufficiently hard and not easily broken by pressure during the curing process.

Figure 6:
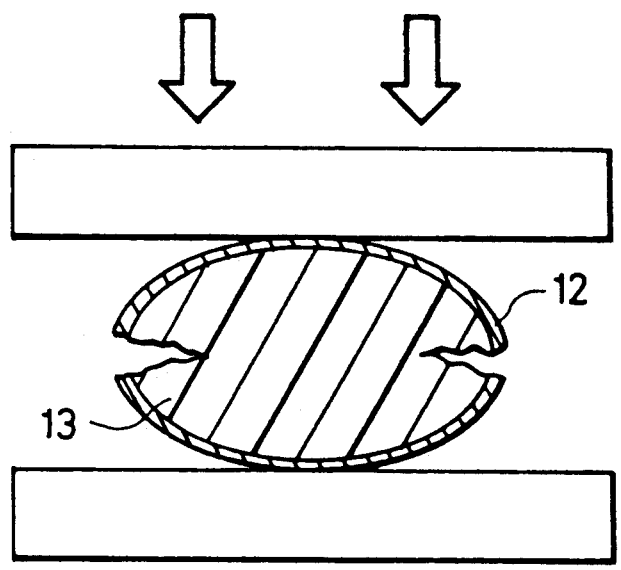
FIG. 6 shows destruction of first particles under excess pressure.

For reference, when electrical connection was made between a glass substrate and a printed board as illustrated in FIG. 5 but without the use of a second particles, many polystyrene particles 13 coated with Au films 12 as the first particles were broken by pressure during the curable process as illustrated in FIG. 6 so that disconnection happened. It is not necessarily impossible to adjust the pressure in order not to break the first particles even without the second particles. The adjustment, however, is very difficult and not practical. Thence second particles are indispensable. The polystyrene particles coated with Au films can be deformed without destruction of 60% of their diameter, which fact was confirmed by experiments. The diameter of the second particles, therefore, is chosen 60% to 95% of that of the first polystyrene particles.

EXPERIMENT 1

A 1200 Å thick ITO film was coated on a first 1.1 mm thick soda lime glass substrate by sputtering. The sheet resistance of the ITO film was measured to the 25 $\Omega$. The ITO film was then patterned into a number of parallel strips of 175 $\mu$m width and 30 mm length by a known photolithography. The number of the strips was 640. The distance between the adjacent strips was 350 $\mu$m. (The interval was 175 $\mu$m) The strips were designed to be extension of electrodes defining pixels for a liquid crystal display.

A 1000 Å thick ITO film was coated on a second 1.1 mm thick soda lime glass substrate by EB evaporation. The ITO film was then severed into a number of parallel strips of 175 $\mu$m width and 30 mm long by a known photolithography. The number of the strips was 640 and the distance between the adjacent strip was 350 $\mu$m corresponding to those of the first substrate. The strips were designed to be connected with driving circuits for the liquid crystal display including ICs. A 5500 Å thick Ni film was formed on the ITO strips by plating. The 500 Å thickness of the Ni film was then replaced by a 500 Å thick Au film also by plating.

The first substrate was placed over the second substrate with a UV light curable resin in which first and second particles were dispersed. The resin was coated on the first or second substrate in advance by a dispenser. In so doing, care was taken in order to align the strips of the first substrate exactly with the corresponding strips of the second substrate. The first particles were prepared by coating polystyrene particles of 7.5 $\mu$m diameter with 1000 Å thick Au films. The second particles were SiO$_2$ particles of 5.0 $\mu$m diameter. The ratio in weight of the resin to the first and second particles were chosen to the 107:14:4. The first and second substrates were then pressed against each other under 2.4 Kg/cm$^2$ and exposed to UV light in order to harden the resin.

As a result, these two sets of electrode strips were electrically coupled. The connection resistance per strip as 0.5 $\Omega$. The insulation resistance between adjacent strips was $2.8 \times 10^9$ $\Omega$. When thermal shock was repeatedly applied 100 times between $-30°$ C. and $+70°$ C. respectively continued for an hour, no connection was found destroyed throughout 120 connection sites.

Experiment 2

Figure 7:
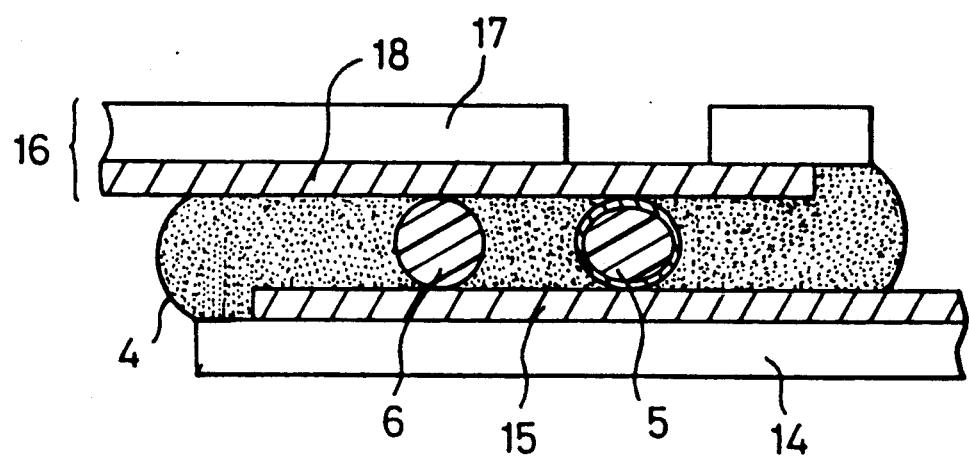
FIG. 7 is an expanded cross sectional views showing electrical connection in accordance with another embodiment of the present invention.

This experiment will be explained in conjunction with FIG. 7. A 1200 Å thick ITO film was coated on a first 1.1 mm thick soda lime glass substrate 14 by sputtering. The sheet resistance of the ITO film was measured to be 25 $\Omega$. The ITO film was then patterned into a number of parallel strips of 175 $\mu$m width and 30 mm length by a known photolithography. The number of the strips was 640. The distance between the adjacent strip was 350 $\mu$m. (The interval was 175 $\mu$m) The strips were designed to be extension of electrodes defining pixels for a liquid crystal display.

OLBs (Outer Lead Bonding) of 8 TABs (Tape Automated Bonding) were used as a second substrates 17. 80 parallel electrode strips 18 of 175 $\mu$m width and 30 mm length were formed in each OLB. These electrodes were made from a copper film of 0.035 mm thickness. The other end of each TAB terminated in an ILB (Inter Lead Bonding). The substrates 17 of the TAB were made from a Kapton film of 0.125 mm thickness manufactured by DuPont Co.

The second substrates 16 were placed over the first substrate 14 with a UV light curable resin 4 in which first and second particles were dispersed. In so doing, care was taken in order to align the strips of the first substrate exactly with the corresponding strips of the second substrates. The first particles were prepared by coating polystyrene particles of 7.5 $\mu$m diameter with 1000 Å thick Au films. The second particles were SiO$_2$ spheres of 5.0 $\mu$m diameter. The ratio in weight of the resin to the first and second particles were chosen to the 107:14:4. The first and second substrates were then pressed against each other under 2.4 Kg/cm$^2$ and exposed to Uv light in order to harden the resin in the same manner as the first experiment.

As a result, these two sets of electrode strips were electrically coupled. The connection resistance per strip was 0.5 $\Omega$. The insulation resistance between adjacent strips was $2.8 \times 10^9$ $\Omega$. When thermal shock was repeatedly applied 100 times between $-30°$ C. and $+70°$ C. respectively continued for an hour, no connection was found destroyed throughout 120 connection sites.

EXPERIMENT 3

This experiment was conducted in substantially same manner as Experiment 1 except for the second substrate. Two printed circuit boards were used as the second substrates. Each board was made of a 1.1 mm thick glass epoxy substrate on which 320 parallel electrodes of 175 $\mu$m width and 30 mm length were formed and connected with circuits formed on the same board. The electrodes were made from a copper film of 0.125 mm thickness. The other processes were same as those of Experiment 1 so that no redundant description is repeated.

As a result, these two sets of electrode strips were electrically coupled. The connection resistance per strip was 0.5 Ω. The insulation resistance between adjacent strips was $2.8 \times 10^9$ Ω. When thermal shock was repeatedly applied 100 times between $-30°$ C. and a $+70°$ C. respectively continued for an hour, no connection was found destroyed throughout 120 connection sites.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. For example, although the embodiments are designed suitable for manufacture of liquid crystal devices, the present invention can be applied for other devices such as image sensors.

What is claimed is:

1. A method of making electrical connection between a first electrode arrangement formed on a first substrate and a second electrode arrangement formed on a second substrate, said method comprising the steps of:
   placing said first substrate on said second substrate;
   aligning the first electrode arrangement with the second electrode arrangement with a UV light curable adhesive therebetween, said adhesive including first conductive particles and second inelastic particles whose diameter is smaller than that of said first particles;
   pressing said first substrate against said second substrate to such extent that the distance between the inner surfaces of said first and second electrode arrangements becomes substantially same as the diameter of said second particles with said first particles being deformed; and
   exposing said adhesive to UV light to cure said adhesive.

2. The method of claim 1 wherein the diameter of said second particles is 60% to 95% of the diameter of said first particles.

3. The method of claim 1 wherein said first particles are resilient particles.

4. A method of making electrical connection between a first electrode arrangement formed on a first substrate and a second electrode arrangement formed on a second substrate, comprising the steps of:
   placing said first substrate on said second substrate;
   aligning the first electrode arrangement with the second electrode arrangement with a curable connecting means therebetween; and
   curing said connecting means while pressing said first and second substrates against each other,
   wherein said curable connecting means comprises a curable adhesive, elastic first particles having conductive surfaces and inelastic second particles.

5. A method as in claim 4 wherein said curable adhesive is a UV curable organic adhesive.

6. A method as in claim 4 wherein said first electrode arrangement comprises transparent conductive strips.

7. A method as in claim 4 wherein said second electrode arrangement comprises transparent conductive strips or metal strips.

8. A method as in claim 4 wherein said first substrate is a glass substrate.

9. A method as in claim 4 wherein said second substrate is a printed circuit board.

10. A method as in claim 4 wherein said second electrode arrangement comprises ITO (indium-tin-oxide) strips.

11. A method as in claim 10 wherein said ITO strips are further provided with a metal layer.

12. A method as in claim 11 wherein said metal layer comprises nickel.

13. A method as in claim 12 wherein said metal layer is provided with a further metal layer comprising Au.

14. A method as in claim 4 wherein said elastic first particles comprise elastic organic particles and metal layers are formed on the surfaces of said organic particles.

15. A method as in claim 4 wherein said inelastic second particles comprise $SiO_2$.

16. A method as in claim 4 wherein said second particles are 60–90% of said first particles in diameter.

* * * * *